(12) United States Patent
Hammond et al.

(10) Patent No.: US 7,683,709 B1
(45) Date of Patent: Mar. 23, 2010

(54) LOW FREQUENCY POWER AMPLIFIER EMPLOYING HIGH FREQUENCY MAGNETIC COMPONENTS

(75) Inventors: Russ Hammond, La Jolla, CA (US); Ed F. Rynne, San Diego, CA (US); Steve Pucillo, Lakeside, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 134 days.

(21) Appl. No.: 12/133,535

(22) Filed: Jun. 5, 2008

(51) Int. Cl.
*H03F 3/38* (2006.01)
(52) U.S. Cl. .......................................... 330/10; 330/165
(58) Field of Classification Search ................... 330/10, 330/146, 154, 165
See application file for complete search history.

(56) References Cited

U.S. PATENT DOCUMENTS

| | | | |
|---|---|---|---|
| 3,958,181 A | 5/1976 | Hansen et al. | |
| 3,984,869 A | 10/1976 | Fujii et al. | |
| 4,000,414 A | 12/1976 | Hansen | |
| 4,006,419 A | 2/1977 | Liman | |
| 4,037,332 A | 7/1977 | Petrusinsky | |
| 4,059,822 A | 11/1977 | Toshioka et al. | |
| 4,085,361 A | 4/1978 | Bathiany et al. | |
| 4,109,642 A | 8/1978 | Reid et al. | |
| 4,147,987 A | 4/1979 | Imamura | |
| 4,218,773 A | 8/1980 | Imamura | |
| 4,228,545 A | 10/1980 | Murakami | |
| 4,317,117 A | 2/1982 | Chasek | |
| 4,450,460 A | 5/1984 | Morimoto | |
| 4,480,335 A | 10/1984 | Kishi | |
| 4,484,295 A | 11/1984 | Bedard et al. | |
| 4,495,651 A | 1/1985 | Froeliger | |
| 4,657,025 A | 4/1987 | Orlando | |
| 4,738,264 A | 4/1988 | Orlando | |
| 4,817,198 A | 3/1989 | Rinderle | |
| 4,878,252 A | 10/1989 | Sessink | |
| 4,890,332 A | 12/1989 | Takahashi | |
| 4,893,288 A | 1/1990 | Maier et al. | |
| 4,905,522 A | 3/1990 | Schlatter et al. | |
| 5,121,639 A | 6/1992 | McShane | |
| 5,132,889 A * | 7/1992 | Hitchcock et al. | ............. 363/17 |
| 5,412,322 A | 5/1995 | Wollin | |
| 5,630,216 A | 5/1997 | McEwan | |
| 5,734,163 A | 3/1998 | Hayashi et al. | |
| 5,737,280 A | 4/1998 | Kokubo | |
| 5,757,187 A | 5/1998 | Wollin | |
| 5,781,419 A * | 7/1998 | Kutkut et al. | ................. 363/17 |
| 5,815,384 A | 9/1998 | Hammond et al. | |
| 5,821,632 A | 10/1998 | Normann et al. | |
| 6,191,724 B1 | 2/2001 | McEwan | |

(Continued)

*Primary Examiner*—Henry K Choe
(74) *Attorney, Agent, or Firm*—Kyle Eppele; J. Eric Anderson

(57) ABSTRACT

A low frequency amplifier uses a switched bridge circuit, providing a first frequency output. A transformer circuit receiving the first frequency output from the switched bridge circuit. Power from the transformer is output from a plurality of secondaries and the power from the secondaries is supplied to the corresponding output switching circuits and provided as switched outputs from the transformer circuit. The switched outputs from the transformer circuit are responsive to a transformer output from the transformer at the first frequency, and switch the transformer outputs in a timed sequence to provide a combined second frequency output. The second frequency output has a lower frequency than the transformer outputs.

24 Claims, 4 Drawing Sheets

U.S. PATENT DOCUMENTS

| | | |
|---|---|---|
| 6,400,580 B1 * | 6/2002 | Bowman et al. .............. 363/17 |
| 6,725,027 B1 | 4/2004 | Tsuji et al. |
| 6,826,392 B2 | 11/2004 | Tsuji et al. |
| 6,985,773 B2 | 1/2006 | Von Arx et al. |
| 7,015,754 B2 * | 3/2006 | Smidt et al. ................. 330/251 |
| 7,120,397 B2 | 10/2006 | Tatemori et al. |
| 7,129,713 B2 | 10/2006 | Katz |
| 2002/0025782 A1 | 2/2002 | Tatemori et al. |
| 2003/0022650 A1 | 1/2003 | Tsuji et al. |
| 2003/0149459 A1 | 8/2003 | Von Arx et al. |
| 2005/0156608 A1 | 7/2005 | Katz |
| 2006/0025834 A1 | 2/2006 | Von Arx et al. |

* cited by examiner

US 7,683,709 B1

LOW FREQUENCY POWER AMPLIFIER EMPLOYING HIGH FREQUENCY MAGNETIC COMPONENTS

FEDERALLY-SPONSORED RESEARCH AND DEVELOPMENT

This invention was developed with funds from the United States Department of the Navy. Licensing inquiries may be directed to Office of Research and Technical Applications, Space and Naval Warfare Systems Center, San Diego, Code 2112, San Diego, Calif., 92152; telephone 619-553-2778; email: T2@spawar.navy.mil.

BACKGROUND

1. Field of the Invention

The disclosed subject matter relates to an amplifier design, of a type using magnetic energy. The disclosed subject matter also relates to low frequency power amplifiers.

2. Background of the Invention

In design of low frequency power amplifiers, it is desired to provide low frequency power amplification in a manner that minimizes amplifier size and weight. Current low frequency power amplifiers are relatively large and heavy. This is because present amplifiers contain magnetic components which must provide operational function at the output signal frequency. Examples of magnetic devices used in the magnetics are transformers and inductors.

The size of a magnetic device (transformer or inductor) varies to a first approximation linearly and inversely with frequency, which means that a magnetic device operating at a higher frequency may be manufactured to be much smaller than one having comparable performance characteristics, but operating at a lower frequency. Thus for a low frequency power amplifier, the size and weight of the magnetics will be many times greater than if the amplifier could be built with all magnetics operating at a switching frequency which was orders of magnitude higher than the desired output signal frequency.

U.S. Pat. No. 5,815,384, to Hammond, et al. describes a transformer circuit in which an AC switching stage preferably generates pulses at a frequency which may be up to several orders of magnitude higher than a line frequency, typically 60 or 400 Hz and having a duty cycle which may be up to about 98-99% of the pulse period. The circuit includes a transformer which requires less core volume and mass than conventional transformers, and includes a rectifier for transforming a first time varying input signal, such as a sinusoid or saw tooth signal, into a full-wave rectified voltage signal.

SUMMARY

A low frequency amplifier is configured to use magnetic elements at a frequency which may be higher than that of the amplified output frequency of the amplifier. A switched bridge circuit provides a first frequency output. A transformer circuit receives the first frequency output from the switched bridge circuit, which results in the transformer operating at the frequency of the first frequency output. A switched output from the transformer circuit is provided and is responsive to a transformer output from the transformer at said first frequency. The transformer output is switched to provide a first sense output and a second sense output in a timed sequence and to provide a second frequency output. In the case of the transformer operating at a higher frequency, the second frequency output has a lower frequency than the first frequency output.

DETAILED DESCRIPTION

A low frequency power amplifier is configured to employ only higher frequency magnetics. This reduces the size of the magnetics, and thereby minimizes amplifier size and weight. The output of the magnetics is provided to a down-convertor, which switches HF signal inputs to simulate a LF output. Pulses in the down-convertor are selectively rectified by switches to steer positive or negative pulses to desired outputs.

Figure 1:
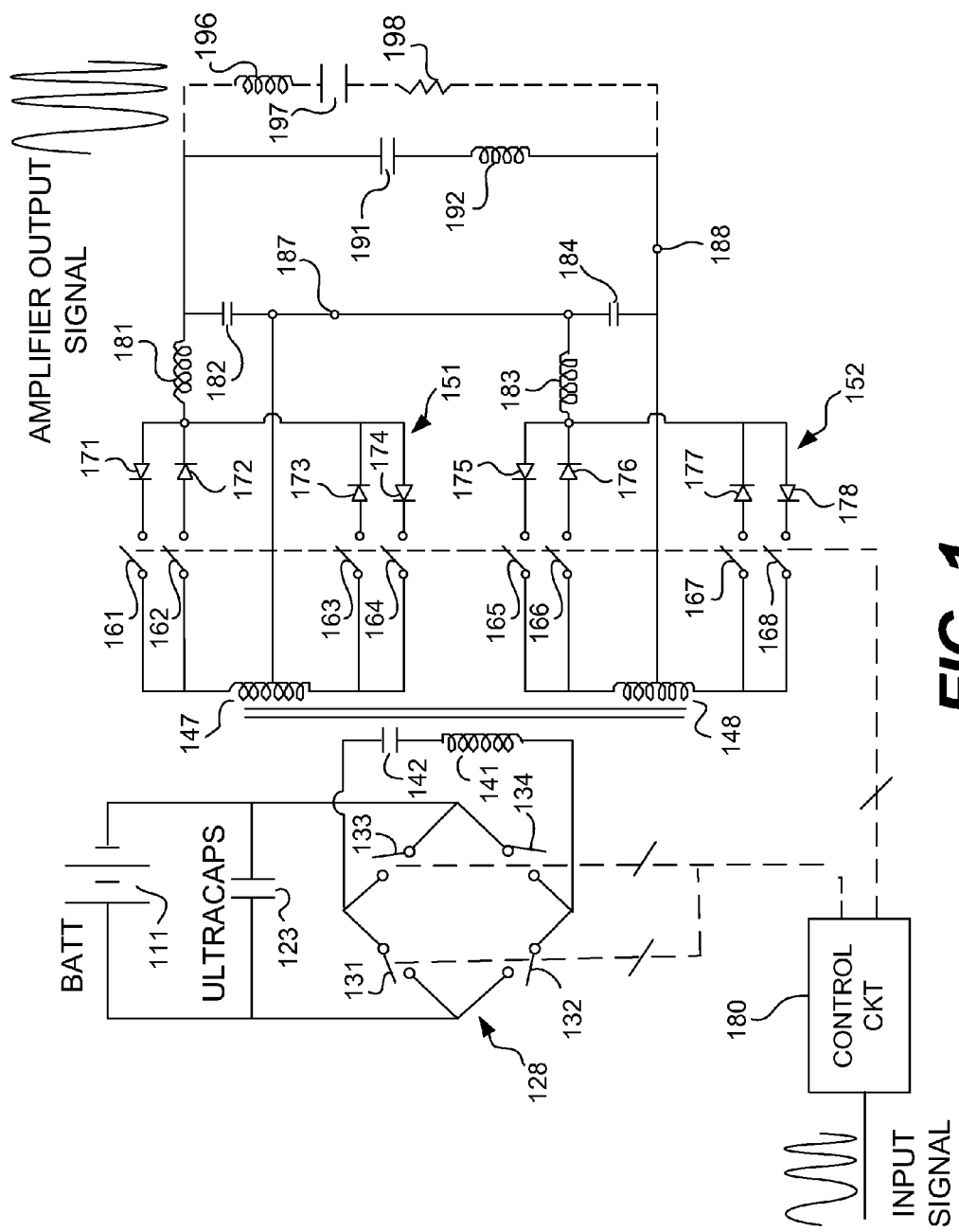
FIG. 1 is a schematic diagram showing an example amplifier.

FIG. 1 is a schematic diagram showing an example amplifier. Energy is supplied by DC source 111. Additional optional energy storage is provided by energy storage capacitor 123, which may be by way of example, an ultra capacitor or a conventional capacitor. A full bridge 128 with switches 131-134 is operated to provide a pulse width modulated (PWM) pulse train for the output signal across amplifier primary 142 and capacitor 141, forming an LC circuit. The output across LC circuit 141, 142 is applied across the transformer (through primary 141) and is the output that is to be amplified.

The DC source 111 can be any convenient power source, such as a battery, outside power supply or the equivalent. With appropriate rectification or switching, an AC power supply can also be used.

Also shown are two secondary coils 147, 148, each of which is connected to switching rectifier inverter output circuits 151, 152. Inverter output circuit 151 comprises switches 161-164 and inverter output circuit 152 comprises switches 165-168. Each of switches 161-168 is series connected to diodes 171-178, respectively. A control circuit 180 is used to control switches 131-134 and switches 161-168. The control of the switches 131-134 and of switches 161-168 is independent, meaning that the switches are typically not turned "on" or "off" simultaneously.

The use of two secondary coils 147, 148 and separate inverter output circuits 151, 152 allows a series voltage output between inverters 151, 152, so that switches 161-168 and diodes 171-178 can have circuit parameters which are approximately half that required for if there were a single inverter output circuit providing the entire output. This is particularly advantageous because of the maximum voltage parameters for commonly available field effect transistor devices used in inverters 151, 152. The use of two inverters 151 is given as an example of multiple inverters, and it is further possible to provide a greater number of secondary coils and inverter output circuits, in order to provide a proportional increase in the output voltage.

A further description of the inverters 151, 152 is found in U.S. Pat. No. 5,815,384, to Hammond, et al., and which is incorporated by reference herein. One advantage of the use of switching techniques, the amplifier may be operated to provide a controlled output voltage signal having an adjustable amplitude that is not completely determined by the turns ratio between the primary and secondary windings of the transformer. In particular, inverters 151, 152 are connected to provide a series output, through LC circuit elements 181-184, at nodes 187, 188.

The outputs of the inverters 151, 152 are capacitively coupled using LC circuits 181, 182, and 183, 184, to provide the output signal at nodes 187, 188. An LC output load 191, 192 provide an output balance. Also shown is an equivalent L-C-R output circuit 196-198.

Figure 2:
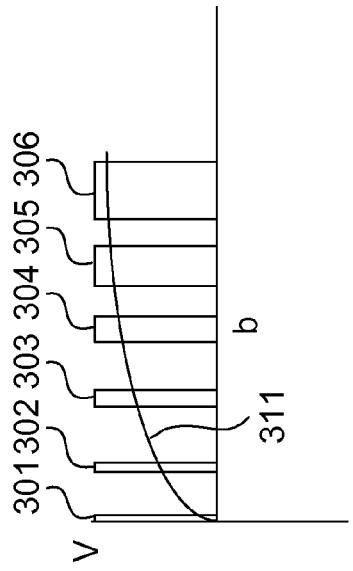
FIG. 2 is a depiction of a pulse train, corresponding to pulses across the output of the bridge.
Figure 3:
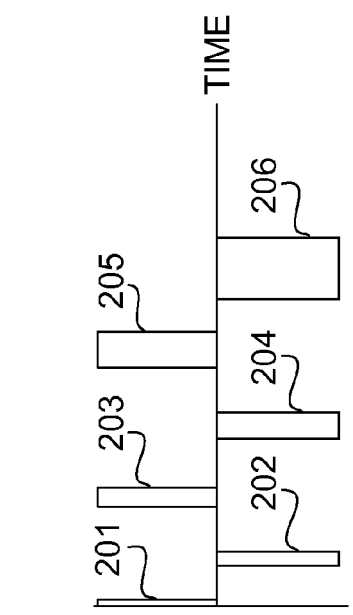
FIG. 3 is viewed during the beginning of a series of positive pulses, but the opposite polarity effect occurs under negative pulses.

FIGS. 2 and 3 are depictions of pulse trains. FIG. 2 shows the pulse train, corresponding to pulses across the output of the bridge 128. Referring to FIG. 1 with reference to FIG. 2, the pulses from bridge 128 are formed positive when switches 131+134 are "on" (closed) and negative when switches 132+133 are "on". These pulses are then selectively rectified by turning switches 161 and 163 "on" (closing 161 and 163) to steer the first positive pulse to output node 187 and the turning 162 and 164 "on" to steer the first negative pulse to output node 188. Using this repeating switch scheme, the voltage across nodes 187, 188 takes the form of a series of pulses 201-206. Pulses 201-206 are switched by output switches 161-168 to provide rectified half wave output pulses 301-306, depicted in FIG. 3. The output pulses 301-306 are smoothed to a sine wave, appearing in FIG. 3 as a portion of a sine wave 311. By operation of switches 161-168, the output is inverted, to generate a full sine wave. FIG. 3 is viewed during the beginning of a series of positive pulses, but the opposite polarity effect occurs under negative pulses. Referring again to FIG. 1, the output filter LC filters 181, 182 and 183, 184 filter this waveform and averages or extracts the fundamental component to form voltage, at output nodes 187, 188.

Switches 161 and 162 are operated in unison and operate at close to a 50% duty cycle. The reason for this will become clear when the reactive energy concerns are discussed. Although, for rectification of the first positive pulse, only 161 is conducting the pulse's energy. Similarly to rectify the first negative pulse 161 and 162 are "on" at close to a 50% duty ratio (on almost half of the output frequency period).

A similar situation exists for the negative half cycle of the signal to be amplified. In the negative half-cycle, the switches 161 and 163 are going to be turned "on" for positive pulses coming from the transformer. Likewise switches 162 and 164 are going to be turned "on" to steer a negative transformer pulse to help form the negative half cycle of the output waveform.

Control circuit 180 is used to control switches 131-134 and switches 161-168 in order to provide the desired output frequencies from bridge 128 and from inverters 151, 152. An example of such a control circuit is described in the aforementioned U.S. Pat. No. 5,815,384, to Hammond, et al. In operation, closing two switches of opposite polarity, meaning 131, 134 or 132, 133, results in current flow through primary coil 141. The operation of switches 131-134 thereby controls the pulse width of pulses 201-206 (FIG. 2).

Figure 4A:
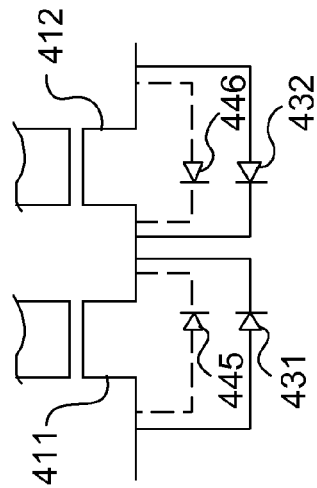
FIGS. 4A and 4B are diagrams showing an implementation of back-to-back FETs.
Figure 4B:
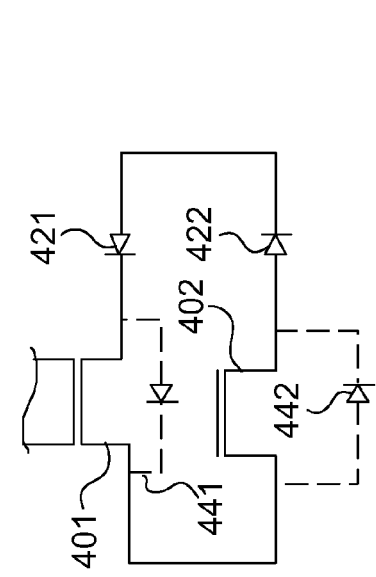

FIGS. 4A and 4B are diagrams showing an implementation of back-to-back FETs 401, 402, 411, 412. Switches 161-164 and 165-168 with their diodes 171-174 and 175-178 could also be implemented as the back-to-back FETs 401, 402, 411, 412 with higher quality bypass diodes 421, 422, 431, 432. This establishes parallel bridge and rectifier circuits 441, 442, 445, 446, which can be used to further step the output voltage.

Referring back to FIG. 1, switches 161-168 are configured to operate in pairs, the pairs being switches 161 and 162, switches 163 and 164, switches 165 and 166, and switches 167 and 168. This is done for convenience of circuit design, since diodes 171-178 function to direct the current flow through switches 161-168. Referring back to FIGS. 4A and 4B, the particular design of FETs is such that the switching function for the separate switches in the pairs of switches 161-168 is easily separated. This also halves the current flow through the individual switches 161-168. By way of non-limiting example, the switches of each pair are opened and closed simultaneously with the other switch in the pair. In other words, simultaneous operation is effected for switches 161 and 162, for switches 163 and 164, for switches 165 and 166, and for switches 167 and 168.

The arrangements of back-to-back FETs 401, 402, 411, 412 are useful for low frequency applications, such as driving sonar transducers. Here voltages of 2500 volts are frequently necessary. Referring to FIG. 1, although a single transformer T1 could step the voltage up to this level, this may exceed the rating of switches 141, 142, 151, 152 that exists for commonly available FETs. The rating of the FETs is a design concern because FETs are the preferred switching element due to ease of drive and speed of transition. It is difficult to find FETs with voltage ratings much past 1200 v and sonar applications often require 2500 v. Thus it would be possible to operate 3 bridge rectifier circuits each with an output voltage of around 800 v or higher, and then to capacitively sum their voltages for the required 2500 volts. If insulated-gate bipolar transistors (IGBTs) are used to implement switches 161-168, their higher voltage rating (~2500 v) would allow fewer stages to be used, for example 2 stages.

Figure 5:
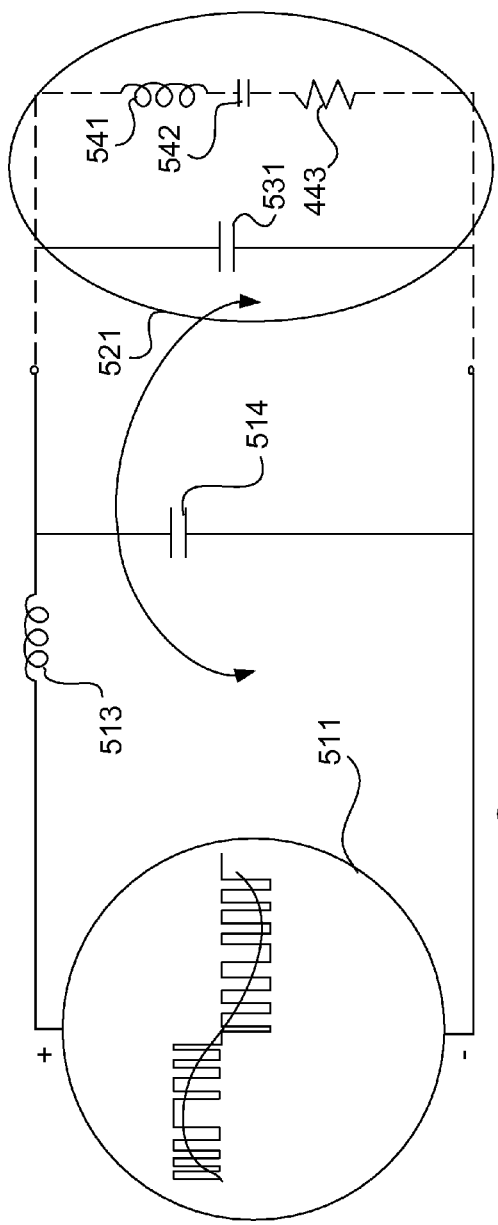
FIG. 5 is a diagram showing an equivalent circuit of the low power amplifier of FIG. 1.

FIG. 5 is a diagram showing an equivalent circuit of the low power amplifier of FIG. 1. A problem to be considered with this approach to amplification is reactive energy. Sonar transducers are highly capacitive and a path back to the DC source 111 must be provided. Essentially the function of this amplifier circuit is to provide a source that looks like that depicted in FIG. 5. A signal generator 511 provides an output through LC circuit 513, 514, which functions as an LC averaging filter. The output is then received by transducer 521, which in a non-limiting example could be a sonar transducer. The sonar transducer 521 is given as a typical reactive load, but the load 521 but may be any suitable load. The reactive load given as an example is considered reactive in that current and voltage is drawn out of phase. The output load has an equivalent circuit which is represented by capacitor 531 in parallel with inductor 541, capacitor 542 and resistor 543.

During the "on" period of the bridge switches (131 134, FIG. 1), a path exists from the load through one of the "on" rectifier switches through the transformer, through the "on" bridge switches 131-134 and into the DC source 111. During the "off" times for the bridge switches 131-134, the path for reactive current is an open circuit unless some other action is taken. For the amplifier to simulate the above ideal source, the bridge switches 131-134 would have to provide a short or zero voltage state for the reactive current. This can be done in the following way.

If, for example, switches 131, 134 are "on", thus delivering a positive pulse, at the completion of the pulse, switch 131 is turned "off". After switches 131 is "off", switch 132 is turned "on". This then allows a shorted path for current to flow. When it is time for a negative pulse to be produced by the bridge, switch 134 is turned "off". When switch 134 is "off", switch 133 is turned "on" and a negative pulse is produced. A similar routine then occurs at the end of the negative pulse to provide a shorted path for reactive current.

Figure 6:
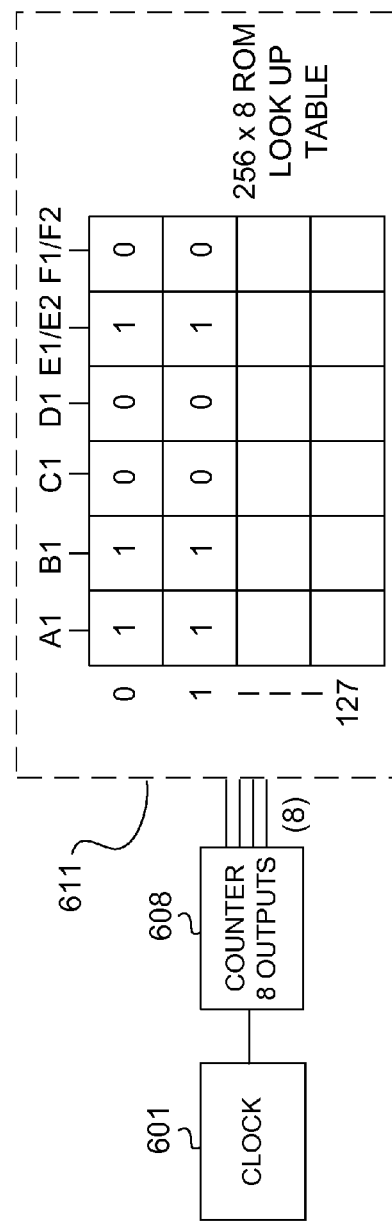
FIG. 6 is a schematic block diagram showing a control circuit implemented with a lookup table (LUT).

An example of a control circuit 180 is depicted in FIG. 6, and comprises a clock 601, counter 608, and lookup table (LUT) 611. In the example, output counter 608 is an 8 output counter, and LUT 611 is implemented as a 256×8 ROM.

Control of switches 131-134 and switches 161-168 is accomplished in response to control circuit 180: An output of clock 601 is inputted into counter 608 which then addresses LUT 611. As this clock counter system goes through all 256 addresses, one switching cycle is executed.

By way of example, given a 25 kHz period, the switching cycle would be approximately 40 ms. For the 161/162 and 171/172 switches the description is straight forward. 161/162 are "on" for the positive half cycle (128 clock pulses) and 171/172 "on" for the negative half cycle (128 clock pulses). Actually there is a short dead time (~100 ns) between turning 161/162 "off" and 171/172 "on" and vice versa.

A more interesting aspect is determining what the states of the bridge switches 131-134 should be. For a desired 1 kHz switching frequency there would be 130 switch periods in an output signal waveform. An even number of switch periods might be preferred as this would tend to drive the bridge transformer equally in the positive and negative direction, although there is a capacitor in series with the bridge transformer primary to prevent transformer saturation. There would potentially be a set of 30 ROM LUTs to be sequentially stepped through to complete a full PWM cycle at 1 kHz. Because the positive and negative half-cycles are symmetric 15 ROM LUTs could probably be used.

Still, because this is a relatively large number, it might be viewed as stepping through one LUT whose individual values are a function of time. Each LUT value would cycle through 15 potential changes in value before repeating. Such an approach could advantageously be implemented in software.

Figure 7:
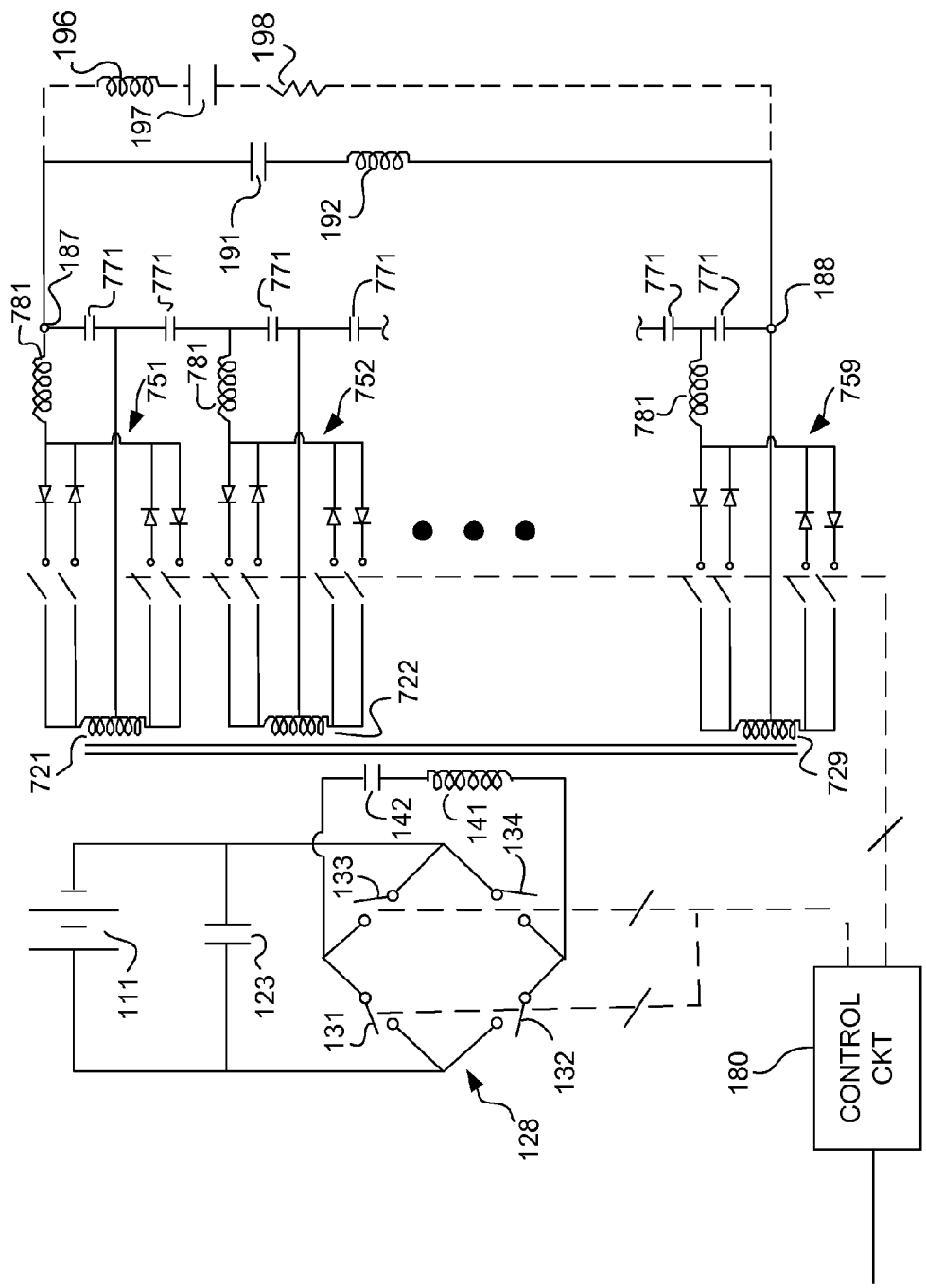
FIG. 7 is a schematic diagram showing an example amplifier, in which a series output arrangement is used to reduce the voltage parameters of switching components.

FIG. 7 is a schematic diagram showing an example amplifier, in which a series output arrangement is used to reduce the voltage parameters of switching components. As is the case with the example of FIG. 1, the front end consists of DC source 111 and energy storage capacitor 123, providing power full bridge 128 with switches 131-134. The output is provided to LC circuit 141, 142.

A plurality of transformer secondaries 721, 722, . . . 729 provide outputs to switching rectifier inverter output circuits 751, 752, . . . 759, which are arranged in series. Switching inverter circuits 751, 752, . . . 759 are isolated by capacitors 771, and by inductors 781. The result is that each inverter circuit 751, 752, . . . 759 is able to include switching and rectifier components (e.g., 161-168 and diodes 171-178 in FIG. 1) having voltage ratings which are a fractional proportion to the output voltage between output nodes 187, 188. Inductors 781 also reduce transients in the switching outputs across the inverter circuits 751, 752, . . . 759.

By way of non-limiting example, if nine inverter circuits 751, 752, . . . 759 are used, and total peak-peak voltage across output nodes 187, 188 is 3500 volts, then the peak-peak voltage across each inverter circuit would be 388 volts. Switching components are more easily available at a rated voltage of 500 volts than at 3500 volts, so that the ability to use lower voltage components is advantageous. If a 3500 volt peak-peak circuit has an approximate RMS voltage of 2500 volts, the RMS voltage across the nine inverter circuits 751, 752, . . . 759 would be 280 volts.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A low frequency amplifier comprising:
   a switched bridge circuit, providing a first frequency output;
   a transformer circuit receiving the first frequency output from the switched bridge circuit;
   a switched output circuit operatively connected to the transformer circuit, responsive to a transformer output from the transformer at said first frequency, the switched output circuit switched to provide a first sense output and a second sense output in a timed sequence to provide a second frequency output, the second frequency output having a lower frequency than the first frequency output;
   said switched output circuit provided as a first switched output circuit;
   at least one additional switched output circuit operatively connected to an additional transformer output and providing an additional second frequency output synchronously with the second frequency output from the first switched output circuit; and
   the first switched output and the additional switched output having serially connected output connections so as to provide the second frequency output from the first switched output and the additional second frequency output in series.

2. The amplifier of claim 1, further comprising an isolation element providing isolation between the first switched output and the additional switched output, the isolation sufficient to allow operation of the first switched output and the additional switched output at circuit parameters corresponding to the proportion of their respective output voltages.

3. The amplifier of claim 2, further comprising a common control circuit for the first switched output and the additional switched output, providing substantially synchronous operation of the first switched output and the additional switched output.

4. The amplifier of claim 3, further comprising:
   a clocked control circuit, responsive to an input frequency and a counter input, and providing an output at the second frequency synchronized with an input frequency.

5. The amplifier of claim 1, further comprising:
   the switched output from the transformer circuit including a first circuit module comprising a plurality of semiconductor switching devices providing opposite polarity outputs from at least one secondary winding of the transformer circuit;
   the switched output from the transformer circuit including at least one additional circuit module comprising a plurality of semiconductor switching devices providing opposite polarity outputs from at least one additional secondary winding of the transformer circuit; and
   the outputs of the circuit modules provided in a series connection.

6. The amplifier of claim 1, wherein the switched bridge circuit provides a pulsed output such that the first frequency output provides operation of the transformer so as to avoid the use of low frequency magnetics inherent in operation at the second frequency output.

7. The amplifier of claim 1 wherein:
   the transformer operates at the first frequency; and
   the second frequency output having a lower frequency than the first frequency output provides operation of the transformer at a frequency higher than the lower frequency as provided by the first frequency output.

8. The amplifier of claim 1 wherein:
   the transformer operates at the first frequency; and the second frequency output having a lower frequency than the first frequency output provides operation of the transformer at a frequency higher than the lower frequency as provided by the first frequency output, the lower frequency output effected by processing of higher frequency pulses through switching components of the amplifier.

9. The amplifier of claim 1, further comprising the switched bridge circuit receiving an input signal from a DC voltage source.

10. The amplifier of claim 1, further comprising:
a clocked control circuit, responsive to an input frequency and a counter input, and providing an output at the second frequency synchronized with an input frequency.

11. A method of providing a low frequency amplifier output, through the use of higher frequency magnetics, the method comprising:
using a switching circuit to provide a first frequency output at the higher frequency;
providing the first frequency output to a transformer circuit;
providing a transformer output from the transformer circuit, responsive to a transformer output from the transformer at said first frequency, and switching the transformer output to provide a first sense output and a second sense output in a timed sequence to provide a second frequency output, the second frequency output having a lower frequency than the first frequency output;
said switched output circuit provided as a first switched output;
providing at least one additional transformer output and switching the additional transformer output synchronously with the second frequency output as an additional switched output; and
providing the first switched output and the additional switched output in series.

12. The method of claim 11, further comprising providing electrical isolation between the first switched output and the additional switched output sufficient to allow operation of the first switched output and the additional switched output at circuit parameters corresponding to the proportion of their respective output voltages.

13. The method of claim 11, further comprising:
providing the switched output from the transformer circuit to a plurality of circuit modules, including a first circuit module comprising a plurality of semiconductor switching devices providing opposite polarity outputs from at least one secondary winding of the transformer circuit, and at least one additional circuit module comprising a plurality of semiconductor switching devices providing opposite polarity outputs from at least one additional secondary winding of the transformer circuit; and
providing the outputs of the circuit modules provided in a series connection.

14. The method of claim 11, further comprising using a switched bridge circuit to provide the first frequency output and providing the first frequency output as a pulsed output such that the first frequency output provides operation of the transformer so as to avoid the use of low frequency magnetics inherent in operation at the second frequency output.

15. The method of claim 11, further comprising:
providing the first frequency output to the transformer at the first frequency so as to avoid the use of low frequency magnetics inherent in operation at the second frequency output, as a result of the transformer operating at the first frequency; and
generating the second frequency output having a lower frequency than the first frequency output.

16. The method of claim 11, further comprising using a switched bridge circuit receiving an input signal from a DC voltage source as the switching circuit to provide a first frequency output at the higher frequency.

17. The method of claim 11, further comprising using a clocked control circuit, responsive to an input frequency and a counter input, and providing an output at the second frequency synchronized with an input frequency.

18. Apparatus for providing a low frequency amplifier output, through the use of higher frequency magnetics, comprising:
circuit switching means, for providing a first frequency output at the higher frequency;
means for providing the first frequency output to a transformer circuit;
a transformer output circuit providing a transformer output from the transformer circuit, responsive to a transformer output from the transformer at said first frequency, and switching the transformer output to provide a first sense output and a second sense output in a timed sequence to provide a second frequency output, the second frequency output having a lower frequency than the first frequency output;
said transformer output circuit provided as a first transformer output circuit;
at least one additional transformer output circuit responsive to an additional transformer output;
means to switch the additional transformer output circuit synchronously with the first transformer output circuit; and
means for providing the outputs from the first transformer output circuit and the second transformer output circuit in series.

19. The apparatus of claim 18, further comprising means for providing electrical isolation between the first transformer output circuit and the second transformer output circuit sufficient to allow operation of the first transformer output circuit and the second transformer output circuit at circuit parameters corresponding to a proportion of their respective output voltages.

20. The apparatus of claim 18, further comprising:
the transformer output circuit including switched output means receiving power from the transformer circuit and comprising a plurality of circuit modules, including a first circuit module comprising a plurality of semiconductor switching devices providing opposite polarity outputs from at least one secondary winding of the transformer circuit, and at least one additional circuit module comprising a plurality of semiconductor switching devices providing opposite polarity outputs from at least one additional secondary winding of the transformer circuit; and
means for providing the outputs of the circuit modules provided in a series connection.

21. The apparatus of claim 18, further comprising:
switched bridge circuit means providing the first frequency output; and
control means providing the first frequency output as a pulsed output such that the first frequency output provides operation of the transformer so as to avoid the use of low frequency magnetics inherent in operation at the second frequency output.

22. The apparatus of claim 18, further comprising:
first frequency output means providing an the first frequency output to the transformer at the first frequency so as to avoid the use of low frequency magnetics inherent in operation at the second frequency output, as a result of the transformer operating at the first frequency; and means for generating the second frequency output having a lower frequency than the first frequency output.

23. The apparatus of claim 18, further comprising:

the first frequency output means using a switched bridge circuit receiving an input signal from a DC voltage source as the switching circuit to provide a first frequency output at the higher frequency.

24. The apparatus of claim 18, further comprising:

clocked control circuit means, responsive to an input frequency and a counter input, and providing the output at the second frequency synchronized with an input frequency.

* * * * *